US006750714B1

(12) United States Patent
McIntyre

(10) Patent No.: US 6,750,714 B1
(45) Date of Patent: Jun. 15, 2004

(54) OPAMP WITH INFINITE OPEN LOOP GAIN

(75) Inventor: Harry Jonathan McIntyre, Los Angeles, CA (US)

(73) Assignee: Xerox Corporation, Stamford, CT (US)

( * ) Notice: Subject to any disclaimer, the term of this patent is extended or adjusted under 35 U.S.C. 154(b) by 54 days.

(21) Appl. No.: 10/320,815

(22) Filed: Dec. 16, 2002

(51) Int. Cl.[7] .................................................. H03F 3/45
(52) U.S. Cl. ........................ 330/255; 330/253; 330/257
(58) Field of Search ................................ 330/253, 255, 330/257

(56) References Cited

U.S. PATENT DOCUMENTS

| 5,146,179 A | * | 9/1992 | Carley et al. ................ 330/253 |
| 6,018,267 A | * | 1/2000 | Tran et al. ................... 330/253 |
| 6,028,479 A | * | 2/2000 | Babanezhad ................ 330/253 |

* cited by examiner

*Primary Examiner*—Patricia Nguyen
(74) *Attorney, Agent, or Firm*—Philip Virga; E. O. Palazzo

(57) ABSTRACT

An operational amplifier circuit connected to a bi-directional cascode current amplifier is disclosed. The operational amplifier uses the bi-directional cascode current amplifier to filter out the common-mode signal resulting in a nearly infinite open loop gain without bandwidth degradation.

20 Claims, 4 Drawing Sheets

OPAMP WITH INFINITE OPEN LOOP GAIN

The present invention relates to an operational amplifier circuit, and to means, which enables an operational amplifier to exhibit a nearly infinite open loop gain without bandwidth degradation.

Operational Amplifiers are used in many electronic applications requiring high sensitivity or accuracy such as instrumentation amplifiers and sensor or detection applications. For these applications, operational amplifier circuits are designed with high gain to provide high sensitivity or accuracy. Yet, as performance improvements in such electronics applications are desirable, so are improvements in the open loop gain of an operational amplifier are desirable.

SUMMARY OF THE INVENTION

In accordance with the present invention, there is disclosed an operational amplifier circuit with a bi-directional cascode current amplifier. The bi-directional cascode current amplifier filters out the common-mode signal resulting in a nearly infinite open loop gain without bandwidth degradation.

DETAILED DESCRIPTION OF THE DRAWINGS

Figure 1:
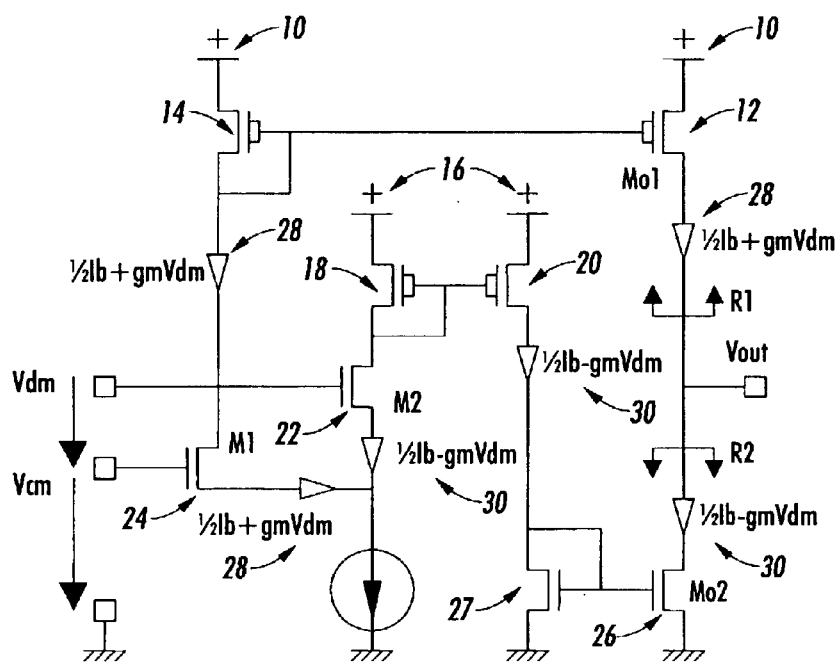
FIG. 1 shows a diagram of a typical amplifier with a push/pull output section.

Referring now to the drawings, FIG. 1 shows a diagram of a typical amplifying circuit with a push/pull output section for use in the present invention. A typical push/pull operational amplifier has a gain defined by the following equation:

$$Avol=(gm1+gm2) \times R1 \| R2;$$

where (gm1+gm2) is the combined transconductance of the input source pair and R1∥JR2 is the combined impedance at the output. Gm 1, gm2 are the transconductance of M1 24, M2 22, respectively. R1 and R2 are the channel resistance of the transistors Mo1 12 and Mo2 26, respecvtively with bias voltage 10. Voltage gain occurs by an input voltage Vin getting converted by gm1 and gm2 into currents ½Ib+gmVdm 28 and ½Ib−gmVdm 30 which are mirrored to Mo1 12 and Mo2 26 and drawn through the channel resistances R2 and R1, respectively.

For infinite gain to occur, Mo2 26 must turn off if current from Mo1 12 is flowing and Mo1 12 must turn off if current from Mo2 26. A typical amplifier does not do this because at the quiescient point, the common mode portion of these current, ½Ib, is non-zero, so Mo1 12 and Mo2 26 are on. To get the desired operation, the common-mode of the amplifier must be set such that the flow of current through Mo1 12 and Mo2 26 are mutually exclusive. Only one transistor may be on at any time. The other must be off to provide an infinity impedance. This occurs when the common mode signal is made zero.

Figure 2:
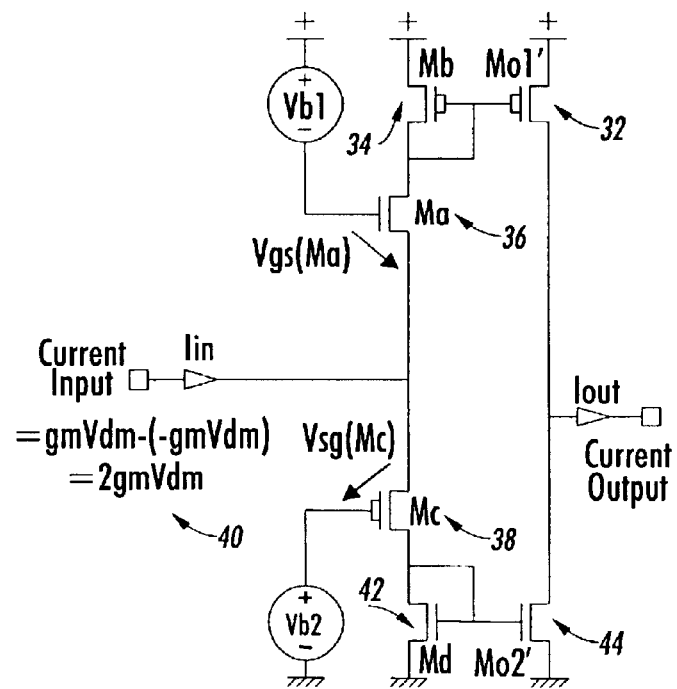
FIG. 2 shows a diagram of an auto sensing directional current driver circuit.

Referring to FIG. 2, there is shown a diagram of an auto sensing directional current driver circuit which provides mutually exclusive differential currents. If Vout of the typical amplifier is connected to the current input node of the current driver circuit, current Iin either flows out of Ma 36 and Mb 34 to be mirrored to Mo1'0 32 or flows into Mc 38 and Md 42 to be mirrored to Mo2' 44. Vb1 and Vb2 are chosen such that Vgs(Ma)+Vsg(Mc) is less than Vthn+Vthp, so current does not flow from Ma 36 to Mc 38. Furthermore, only a non-zero Iin current can cause Vgs(Ma) to become greater than Vthn or Vsg(Mc) to become greater than Vthp. As in can flow in only one direction at a time, Iin cannot flow into both Ma 36 and Mc 38, but only one or the other. So the current becomes only differential current, as the common-mode current is filtered out.

Figure 3:
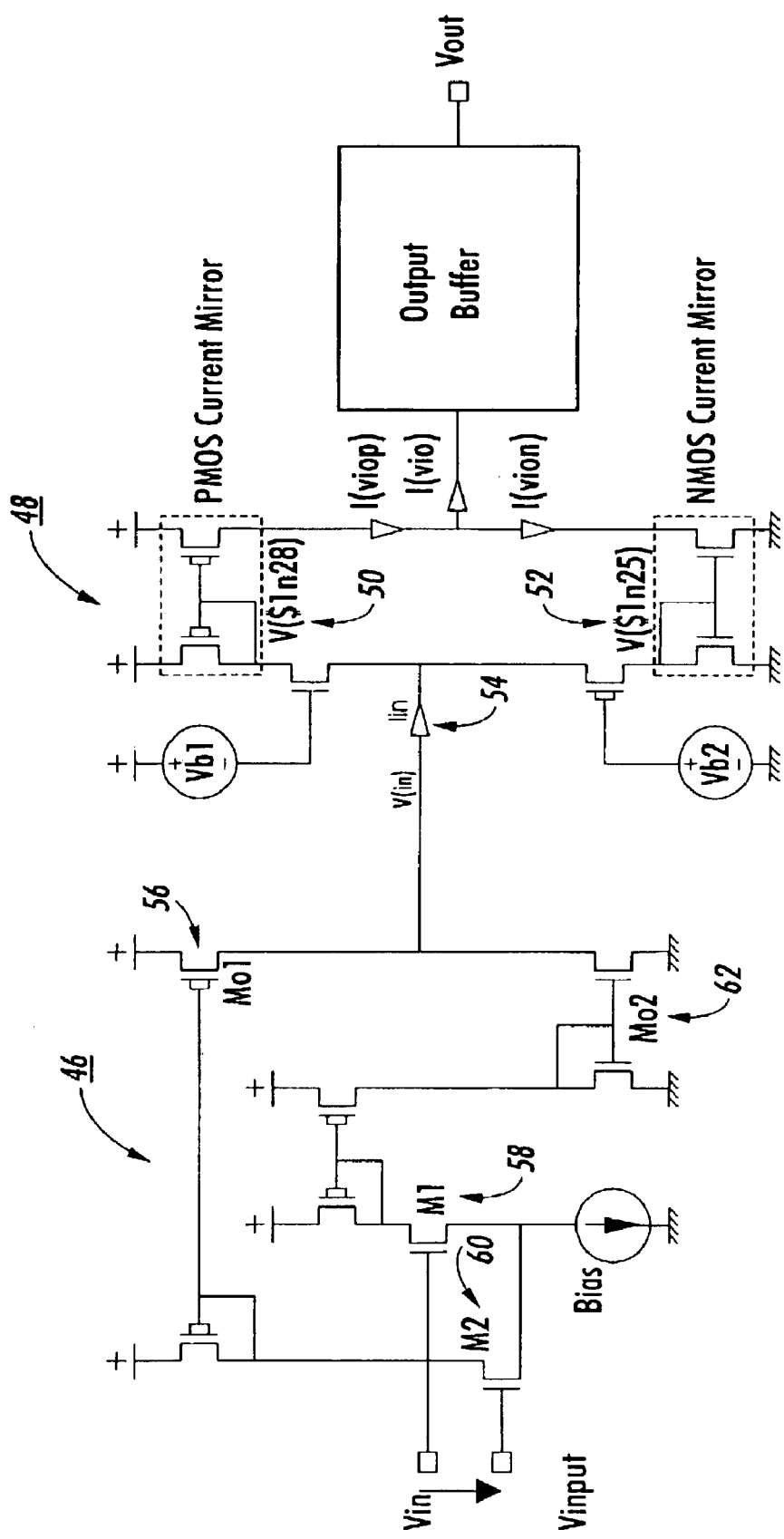
FIG. 3 shows a diagram of the circuit of FIG. 1 connected to the circuit of FIG. 2 resulting in an operational amplifier circuit in accordance with the present invention.

All that is needed is to attach the input 54 of the circuit of FIG. 2 into the output of the typical opamp in FIG. 11, as shown in FIG. 3. The output current of the sensor is either sinking or sourcing, without any overlap or gap between the sinking and sourcing currents. The currents are thus mutually exclusive and when one is flowing, it is being drawn through an off transistor, an infinite impedance, creating an infinite gain except for the possible effects of some parasitics.

To finish the infinite gain opamp, an output section 60 without resistive input load is needed. Such circuits are common. The output section buffers the output node of the sensing current from possible resistive loads connected to the amplifiers output. The finished amplifier is in accordance with the present invention is shown in FIG. 3.

Figure 4:
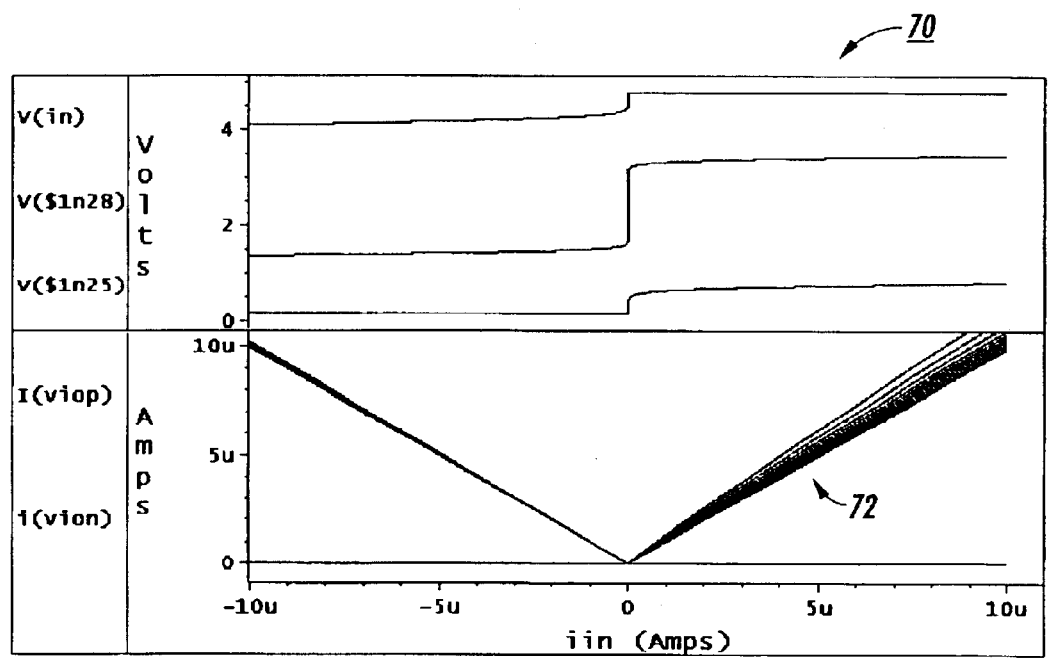
FIG. 4 shows a graphical representation of the node voltages and branch currents of the sensing circuit versus current.
Figure 5:
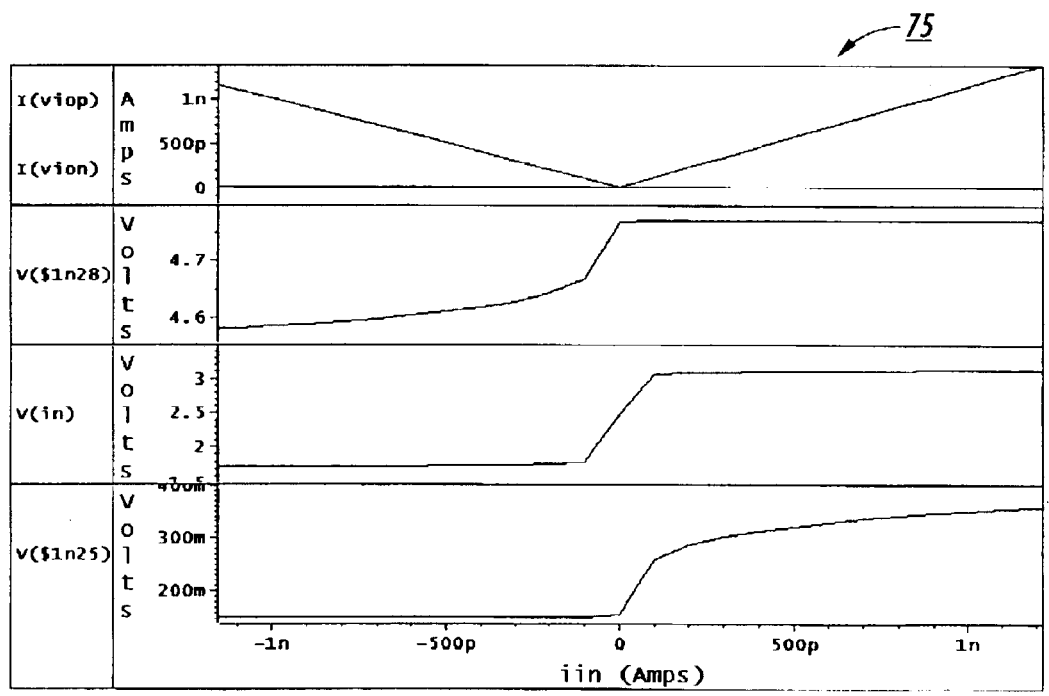
FIG. 5 is an enlarged graphical representation of FIG. 4.
Figure 6:
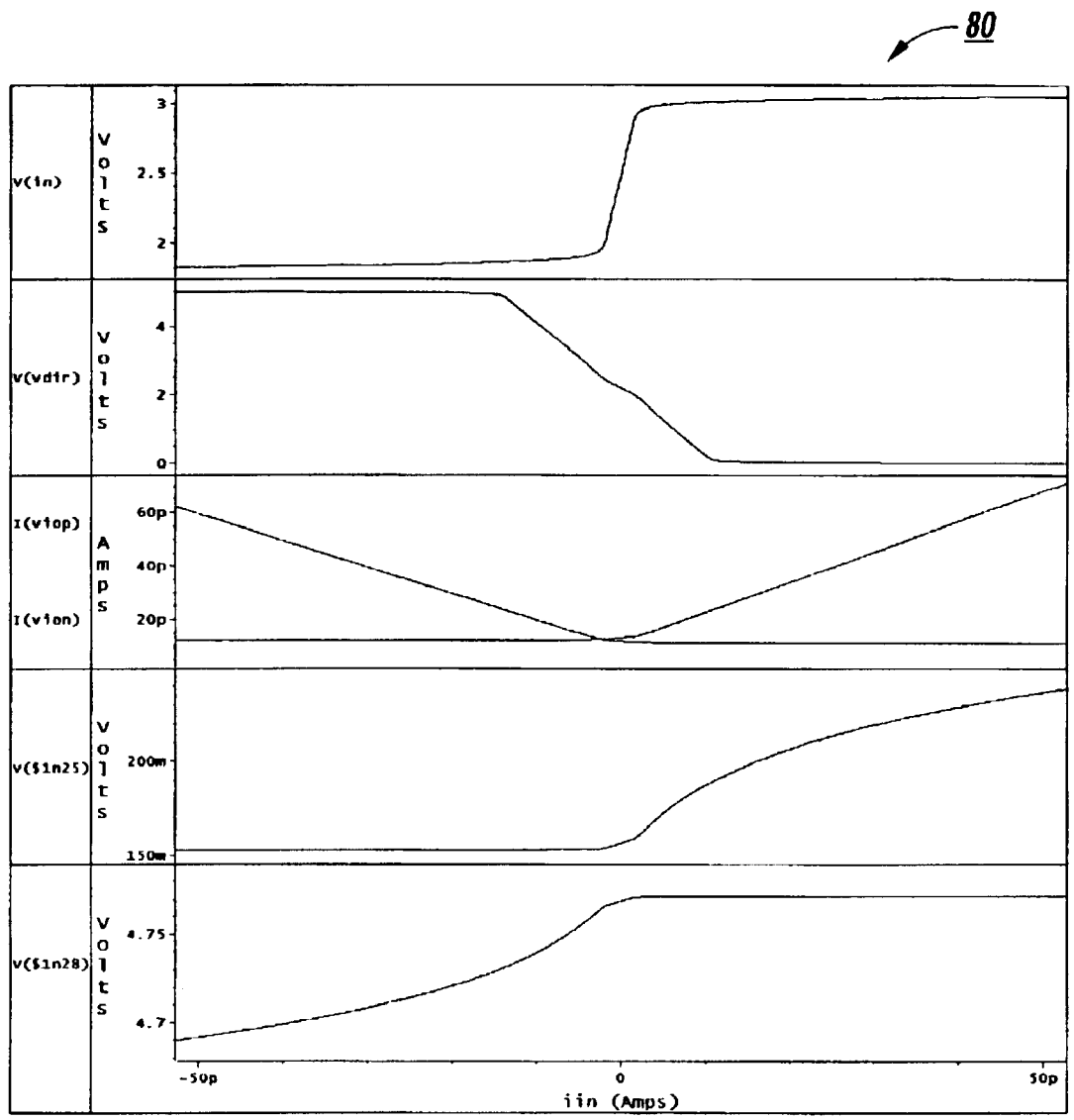
FIG. 6 is an enlarged graphical representation of FIG. 5.

Referring to FIGS. 4 through 6 there is shown graphical representations of computer simulation results of the sensing circuit shown in FIG. 3. FIG. 4 graphically illustrates the computer sources 70 into the V(in) node 54 the current "$i_{in}$" from −10 uA to 10 uA. It repeats this ramp 11×'s, one for each I(vio) nodal voltage of 0.0, 0.5, 1.0, 1.5 to 5.0V. The node voltages V($1n28$) 50, V($1n25$) 52, V(in) 54 and branch currents I(viop) and I(vion) 72 as shown in FIG. 4 are monitored. For negative input currents, V($1n28$) 50 indicates a non-zero Vsg for the PMOS current mirrors 48. Similarly, V($1n25$) 52 indicates a non-zero Vgs for the NMOS current mirror. V(in)'s transition at Iin=0 is the circuit switching from one current mirror to the other. The output current I(vio) is the difference of the two currents, currents I(viop) and I(vion) which simulate as expected, ranging from 10 uA to 0 uA with no overlap or gap. Referring to FIG. 5, the graphical representation 75 zooms in on −1 nA<Iin<1 nA, and shows that there is no discontinuity of the voltage V(in) or the current I(vio)=I(viop) I(vion). Hence there is no "dead zone" despite the overlap of Vsg(Ma) an Vgs(Mc). This new current amplifier acts as an auto-direction sensing current driver that makes R1∥R2 to be infinite (open circuit) at the quiescent point, so the gain equals infinity, except for the effects of parasitics. The parasitic effects 80 can be seen in FIG. 6 were currents I(viop) and I(vion) are shown to have low levels of about 12 pA, within the range of source/drain reverse leakage currents.

It should be noted that numerous changes in details of construction and the combination and arrangement of elements may be resorted to without departing from the true spirit and scope of the invention as hereinafter claimed.

What is claimed is:

1. An operational amplifier circuit comprising;
an operational amplifier connected to a bi-directional cascode current amplifier wherein said current amplifier filters out common mode signals resulting in nearly infinite open loop gain without bandwidth degradation.

2. The operational amplifier circuit according to claim 1 wherein said operational amplifier has a push/pull output section.

3. The operational amplifier circuit according to claim 1 wherein said bi-directional cascode current amplifier is an auto sensing directional current driver circuit which provides mutually exclusive differential currents.

4. The operational amplifier circuit according to claim 1 wherein said bi-directional cascode current amplifier turns on only one transistor at a time.

5. The operational amplifier circuit according to claim 1 wherein said bi-directional cascode current amplifier turns on one transistor while keeping another transistor off when the common mode signal is made zero.

6. The operational amplifier circuit according to claim 1 wherein a common-mode of said bi-directional cascode current amplifier must be set such that a flow of current through a first MOSFET and a second MOSFET are mutually exclusive.

7. The operational amplifier circuit according to claim 1 wherein said bi-directional cascode current amplifier is an auto sensing directional current driver circuit wherein an output current of the sensor is either sinking without any overlap or gap between the sinking and sourcing currents.

8. The operational amplifier circuit according to claim 1 wherein said bi-directional cascode current amplifier is an auto sensing directional current driver circuit wherein an output current of the sensor is sourcing, without any overlap or gap between the sinking and sourcing currents.

9. The operational amplifier circuit according to claim 1 wherein said bi-directional cascode current amplifier is connected to an output section without resistive input load.

10. An operational amplifier circuit comprising;
an operational amplifier connected an auto sensing directional current driver circuit for filtering out common mode signals resulting in nearly infinite open loop gain without bandwidth degradation.

11. The operational amplifier circuit according to claim 10 wherein said operational amplifier has a push/pull output section.

12. The operational amplifier circuit according to claim 10 wherein said auto sensing directional current driver circuit which provides mutually exclusive differential currents.

13. The operational amplifier circuit according to claim 10 wherein said auto sensing directional current driver circuit turns on only one transistor at a time.

14. The operational amplifier circuit according to claim 10 wherein said auto sensing directional current driver circuit turns on one transistor while keeping another transistor off when the common mode signal is made zero.

15. The operational amplifier circuit according to claim 10 wherein a common-mode of said auto sensing directional current driver circuit must be set such that a flow of current through a first MOSFET and a second MOSFET are mutually exclusive.

16. The operational amplifier circuit according to claim 10 wherein an output current of the sensor is either sinking without any overlap or gap between the sinking and sourcing currents.

17. The operational amplifier circuit according to claim 10 wherein an output current of the sensor is sourcing, without any overlap or gap between the sinking and sourcing currents.

18. An operational amplifier circuit comprising;
an operational amplifier connected an auto sensing directional current driver circuit which provides mutually exclusive differential currents for filtering out common mode signals resulting in nearly infinite open loop gain without bandwidth degradation.

19. The operational amplifier circuit according to claim 18 wherein said auto sensing directional current driver circuit turns on only one transistor at a time.

20. The operational amplifier circuit according to claim 19 wherein said auto sensing directional current driver circuit turns on one transistor while keeping another transistor off when the common mode signal is made zero.

* * * * *